United States Patent [19]

Kahen et al.

[11] Patent Number: 4,995,049
[45] Date of Patent: Feb. 19, 1991

[54] OPTOELECTRONIC INTEGRATED CIRCUIT

[75] Inventors: Keith B. Kahen, Rochester; Gopalan Rajeswaran, Fairport, both of N.Y.

[73] Assignee: Eastman Kodak Company, Rochester, N.Y.

[21] Appl. No.: 529,830

[22] Filed: May 29, 1990

[51] Int. Cl.$^5$ .................................................. H01S 3/19
[52] U.S. Cl. .................................... 372/50; 372/38; 372/46; 357/17; 357/19
[58] Field of Search ................ 372/45, 46, 50, 38; 357/16, 4, 61, 58, 17, 19

[56] References Cited

U.S. PATENT DOCUMENTS

| | | | |
|---|---|---|---|
| 3,535,532 | 10/1970 | Merryman | 250/217 |
| 3,914,137 | 10/1975 | Huffman et al. | 148/175 |
| 4,274,104 | 6/1981 | Fang et al. | 357/19 |
| 4,275,404 | 6/1981 | Cassiday et al. | 357/19 |
| 4,366,567 | 12/1982 | Fukuzawa | 372/38 |
| 4,532,694 | 8/1985 | Kolbas | 29/569 |
| 4,607,368 | 8/1986 | Hori | 372/45 |
| 4,608,696 | 8/1986 | Law et al. | 372/50 |
| 4,727,556 | 2/1988 | Bornham et al. | 372/50 |
| 4,745,452 | 5/1988 | Sollner | 357/30 |
| 4,766,472 | 8/1988 | Brillouet et al. | 357/19 |
| 4,777,516 | 10/1988 | Deschler et al. | 357/17 |
| 4,788,690 | 11/1988 | Akiba et al. | 372/50 |
| 4,794,609 | 12/1988 | Hara et al. | 372/50 |
| 4,802,182 | 1/1989 | Thornton et al. | 372/50 |
| 4,829,346 | 5/1989 | Kafahara et al. | 357/22 |
| 4,845,723 | 7/1989 | Heinen et al. | 372/38 |
| 4,847,665 | 7/1989 | Mand | 357/16 |
| 4,847,846 | 7/1989 | Sone et al. | 372/50 |

OTHER PUBLICATIONS

"Monolithic Integration of an Injection Laser and a Metal Semiconductor Field Effect Transistor", by I. Ury et al, Published in Applied Physics Letters, vol. 34, No. 7, Apr. 1, 1979, pp. 430-431.
"A Monolithically Integrated Optical Repeater", by M. Yust et al, Applied Physics Letters, vol. 35, No. 10, Nov. 15, 1979, pp. 795-796.
"Monolithic Integration of a GaAlAs Injection Laser with a Schottky-Gate Field Effect Transistor", by T. Fukuzawa et al, Applied Physics Letters, vol. 36, No. 3, Feb. 1, 1980, pp. 181-182.
"Monolithic Integration of a Very Low Threshold GaIn AsP Laser and Metal-Insulator-Semiconductor Field-Effect Transistor on Semi-Insulating MP", by V. Koren et al, Applied Physics Ltrs, vol. 40, No. 8, Apr. 15, 1982, pp. 643-644.
"Very High Frequency GaAlAs Laser Field-Effect Transistor Monolithic Integrated Circuit", by I. Ury et al, Applied Physics Letters, vol. 41, No. 2, Jul. 15, 1982, pp. 126-128.

Primary Examiner—Frank Gonzalez
Assistant Examiner—Galen J. Hansen
Attorney, Agent, or Firm—Raymond L. Owens

[57] ABSTRACT

The present invention relates to an optoelectronic integrated circuit which includes a body of a group III-V semiconductor material containing a laser diode, a photodiode and/or field effect transistors. The body includes isolation regions extending partially therethrough which electrically isolate the laser diode from the photodiode and the field effect transistors. However, the isolation regions are at least partially transparent to light so as to allow some of the light generated by the laser diode to reach the photodiode. The laser diode, photodiode and/or field effect transistors are electrically connected by conductive patterns on the body so as to form a desired circuit for controlling the laser diode. The body defines a laser diode having a multiple quantum well active layer sandwiched between two cladding layers. The photodiode may also be formed by the active layer and cladding layers or can be formed by filling a trench in the body with a semiconductor material. The field effect transistor is formed in an insulated cap layer of undoped gallium arsenide on one of the cladding layers.

27 Claims, 4 Drawing Sheets

OPTOELECTRONIC INTEGRATED CIRCUIT

FIELD OF THE INVENTION

The present invention relates to a laser diode optoelectronic integrated circuit, and, more particularly, to an optoelectronic integrated circuit which includes along with a laser diode, field effect transistors (FETs) and/or a photodiode.

BACKGROUND OF THE INVENTION

Junction type laser diodes formed in a body of a group III-V semiconductor material have found use in optoelectronic circuits because of their small size and relatively low power requirements. In optoelectronic circuits using such laser diodes, it is important to be able to switch the laser diode on and off at high rates, and to maintain a stabilized laser diode output. The fast switching can be achieved by means of a drive circuit formed of field effect transistors (FETs). Stable laser diodes can be obtained by monitoring the output of one of the facets of the laser diode with a photodiode and using the photodiode in a feedback loop.

FIG. 1 shows a typical circuit 10 having n-channel depletion mode junction field effect transistors T1, T2, T3, T4 and T5, a laser diode LD, a photodiode PD, resistors R1 and R2 and a feedback circuit FBC. Feedback circuit FBC is coupled from an output (VOUT) terminal, which is coupled to the source of transistor T5 and to a first terminal of resistor R2, to the gate of transistor T1. Transistor T1 controls the amount of current which flows therethrough into transistors T2 or T3. Transistor T4 serves to provide a bias current into laser diode LD. The current provided by T4 to laser diode LD is not sufficient by itself to cause laser diode LD to emit light. Transistors T2 and T3 form a differential pair and current from transistor T1 will flow through the one of transistors T2 and T3 which has the gate coupled to a high voltage. The other gate of the two transistors will be at a low voltage. The a' at the gate of transistor T3 indicates that the voltage level applied thereto is the inverse of that applied to the gate (a) of transistor T2. When current from transistors T1 and T4 both flow through laser diode LD, LD emits laser light. Some of the emitted laser light is incident upon photodiode PD and modifies the voltage level at the gate of transistor T5. The current flow through transistor T5 is thus modulated by the amount of laser light incident upon the photodiode PD. Feedback circuit FBC feeds back part of the output voltage (VOUT) to the gate of transistor T1 and thus modulates the current flow through transistor T1. Accordingly, the amount of laser light emitted by laser diode LD and incident on photodiode PD modulates the current flow into the laser diode LD and thus stabilizes same. Although the circuit 10 can be made of discrete components or several integrated circuits connected together with the laser diode, it is desirable to have an optoelectronic integrated circuit which includes the laser diode, photodiode, the FETs and the resistors as a single solid state structure.

SUMMARY OF THE INVENTION

The present invention is directed to an optoelectronic integrated circuit which comprises at least a photodiode, a laser diode and an electrical device. The circuit comprises a body of a group III-V semiconductor material having an active layer extending therethrough with a first insulating layer sandwiched between the body and a second semiconductor layer. The laser diode, which is adapted to generate light in the active layer during operation thereof, is formed in a first section of the circuit which comprises a first portion of the body and first portions of the first and second layers. The photodiode, which is adapted to receive at least some of the light generated by the laser diode and to generate electron-hole pairs, is formed in a second section of the circuit which comprises a second portion of the body and second portions of the first and second layers. The first and second sections of the circuit are electrically isolated from each other. The electrical device is formed in a portion of the second layer in a third section of the circuit which comprises a third portion of the body and third portions of the first and second layers.

In a preferred embodiment the electrical device is a transistor and an electrical insulation region extends through a portion of the body including the active layer. The insulation region is a region in which the semiconductor material is disordered.

The invention will be better understood from the following more detailed description taken with the accompanying drawings and claims.

Figure 1:
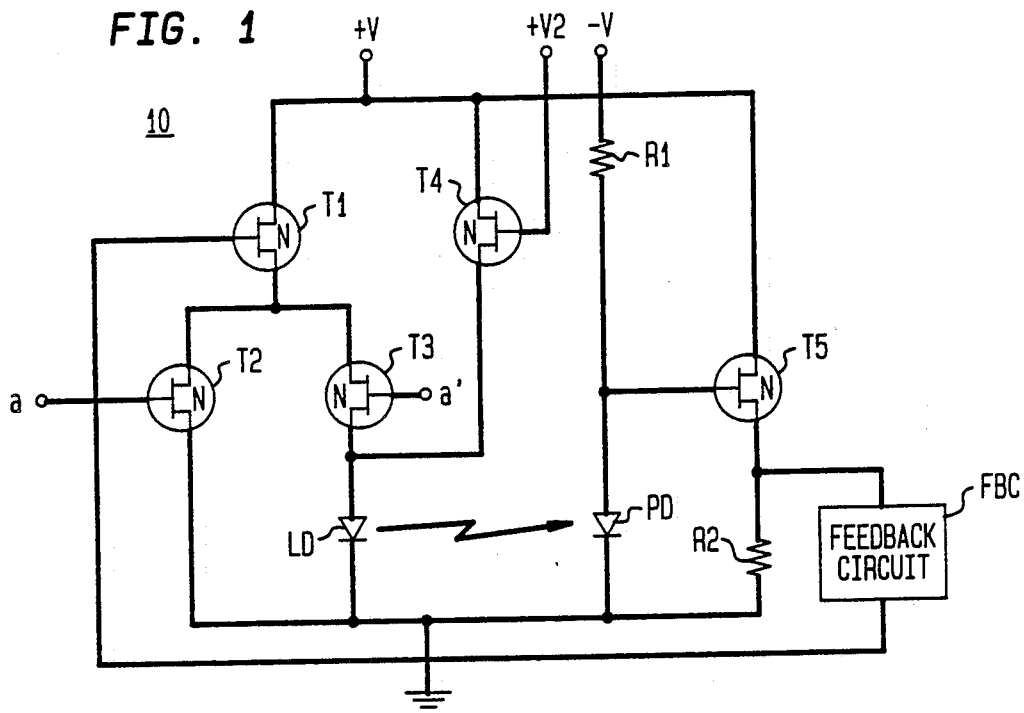
FIG. 1 is a circuit diagram of a typical optoelectronic circuit.

It should be understood that the FIGs. of the drawing are not necessarily drawn to scale.

DETAILED DESCRIPTION

Figure 2:
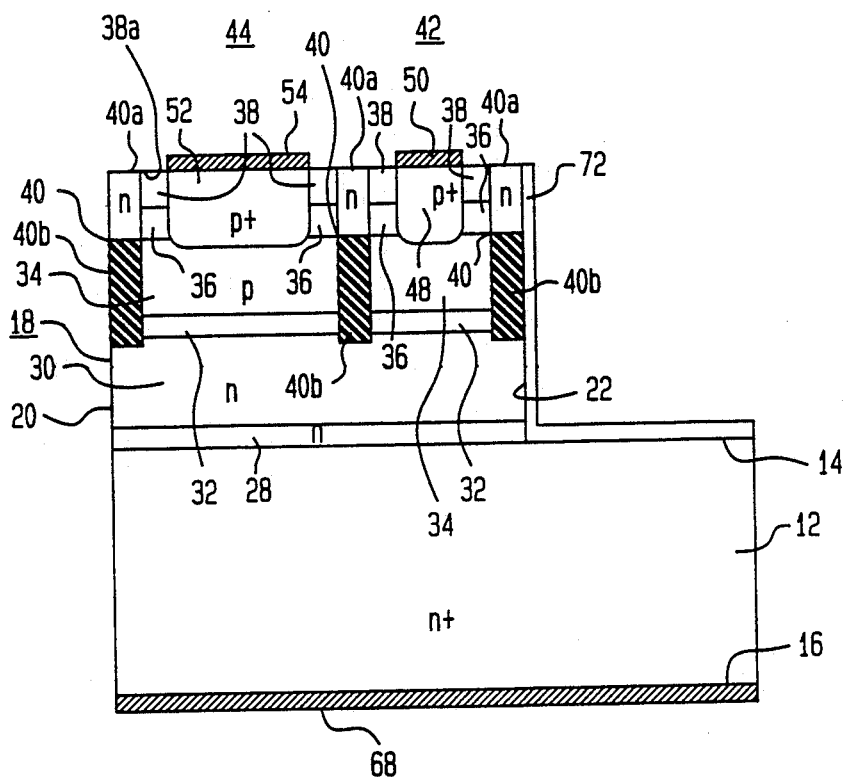
FIG. 2 is a sectional view of one form of an optoelectronic integrated circuit of the present invention.
Figure 3:
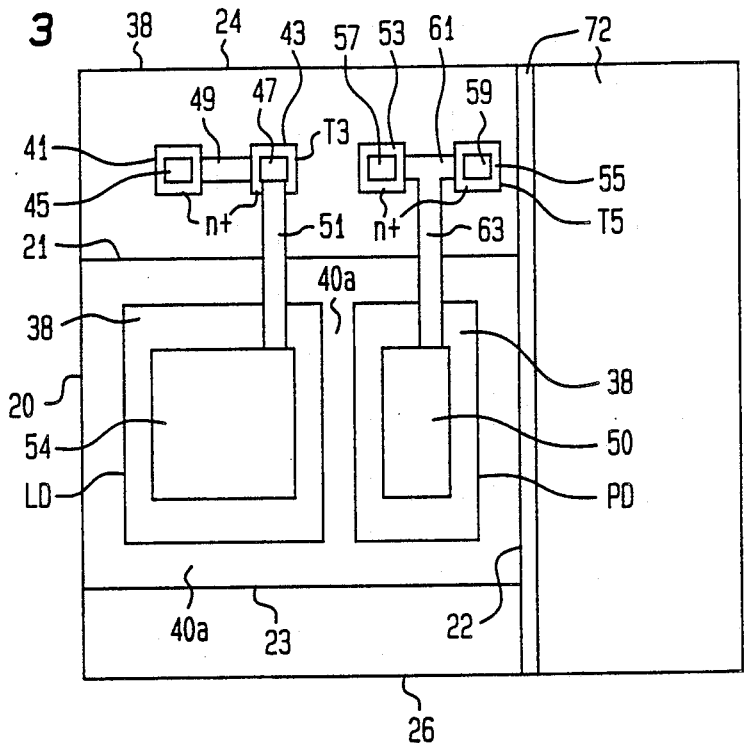
FIG. 3 is a top plan view of the optoelectronic integrated circuit shown in FIG. 2.

Referring now to FIGS. 2 and 3, there are shown a cross-sectional and top view respectively, of portions of an optoelectronic integrated circuit 11 in accordance with the invention. The integrated circuit 11 comprises a substrate 12 of a highly conductive group III-V semiconductor material, such as gallium arsenide, of one conductivity type (shown as n+). The substrate 12 has a pair of opposed surfaces 14 and 16. On the surface 14 of the substrate 12 is a substantially rectangular body 18 of a group III-V semiconductor material having opposed first end surfaces 20 and 22 and second end surfaces 24 and 26 extending between the end surfaces 20 and 22. The body 18 comprises a buffer layer 28 on the substrate surface 14 and of the same material as the substrate 12. On the buffer layer 28 in succession are a first cladding layer 30, a thin active layer 32, a second cladding layer 34, a first cap layer 36 and a second Cap layer 38. Circuit 11, which is useful to implement the circuit 10 of FIG. 1, comprises the laser diode LD, the photodiode PD, and the n-channel field effect transistors T3 and T5 of circuit 10 of FIG. 1.

In an illustrative embodiment, the cladding layers 30 and 34 are preferably supperlattice layers formed of alternating layers of 30 Angstroms of gallium arsenide (GaAs) and 10 Angstroms of either aluminum arsenide (AlAs) or aluminum gallium arsenide having a high content of aluminum ($Al_{0.9}Ga_{0.1}As$). The cladding layers 30 and 34 are of a thickness of between 0.5 and 1 micrometer and are of opposite conductivity types such as n-type for the cladding layer 30 and p-type for the cladding layer 34. The active layer 32 is a multiple quantum well layer comprising six periods of 100 Angstroms of gallium arsenide (GaAs) alternating with five periods of 100 Angstroms of aluminum gallium arsenide ($Al_{0.33}Ga_{0.67}As$). Alternatively, the cladding layers 30 and 34 could be of aluminum gallium arsenide of opposite conductivity type, such as n-type for the first cladding layer 30 and p-type for the second cladding layer 34. The aluminum gallium arsenide can be doped with an appropriate impurity such as carbon to make it p-type and with silicon to make it n-type. The first cap layer 36 is of undoped aluminum gallium arsenide so as to be substantially insulating (preferably $10^{10}$ impurities/$cm^3$ or less), and the second cap layer 38 is of undoped gallium arsenide so as to be insulating and having a conductivity range of about $10^{11}$ to $10^{15}$ impurities/$cm^3$.

The body 18 is divided into several sections by separation regions 40 which each comprise an isolation region 40a and a disordered region 40b. Separation regions 40 extend from surface 38a through layers 38, 34, 36, 32 and into a portion of layer 30. They also extend from first end surface 20 to second end surface 22 and between interface surfaces 21 and 23. A portion of layer 30 is disordered in order to insure that a vertical section completely through layer 32 is disordered. Layer 30 need not be disordered at all, or, as is shown a partial vertical section thereof can be disordered. As shown, the body 18 is divided into two sections 42 and 44. However, as will be explained, the body 18 can be divided into more sections depending on the integrated circuit being formed. The separation regions 40 are formed by using donor impurity disordering to convert the superlattice structures of the layers 32 and 34 into n-type conductivity aluminum gallium arsenide (Al-GaAs) layers. The disordering is produced by either ion implantation of silicon followed by thermal annealing and/or diffusion of an n-type conductivity impurity, such as silicon. The sections 42 and 44 become isolated because the disordered n-type AlGaAs layers have a different polarity and have a larger energy gap than the p-type superlattice layers 32 and 34, which in turn forms a potential barrier to the flow of holes across the disordered regions. The portions of capping layers 36 and 38 which are exposed to the n-type impurities become separation regions 40a which are of n-type conductivity.

The separation regions 40 extend along the end surfaces 20 and 22 and along the interface surfaces 21 and 23 of the body 18. The portion of the separation region 40 along the interface surfaces 21 and 23 serves to some extent to confine laterally the laser light and the carriers emitted from layer 52. The portion of the separation region 40 along the end surfaces 20 and 22 serves to prevent catastrophic facet damage as a result of laser induced facet heating.

A metal contact 68 is on the surface 16 of the substrate 12 and forms an ohmic contact thereto. A mirror 72 is on the end surface 22 of the body 18. The mirror 72 may be made of any suitable metal.

In the section 42, a highly conductive region 48 of p-type conductivity (shown as p+) extends through the cap layers 38 and 36 to the second cladding layer 34. A metal contact 50 is on the second cap layer 38 over the conductive region 48 and makes ohmic contact thereto. The first section 42 forms a photodiode. In the section 44, a highly conductive region 52 of p-type conductivity (shown as p+) extends through the cap layers 38 and 36 to the second cladding layer 34. A metal contact 54 is on the second cap layer 38 over the conductive region 52 and makes ohmic contact thereto. The second section 44 forms a laser diode.

In an illustrative embodiment substrate 12 has a thickness of about 100 microns or greater and body 18 has a thickness of about 5 microns or less.

Integrated circuit 11 is operated by applying a voltage across the second section 44 between the contacts 54 and 68 of a proper level. Light is generated in the active layer 32 by recombination of oppositely charged carriers. The light travels along the active layer 32 and is reflected back and forth between the end surface 20 and mirror 72 to form a substantially coherent beam of light.

Although the separation regions 40 are electrically insulating, they are optically transparent so that the light generated by the laser diode in the section 44 passes into and through the section 42. In the section 42, which is not biased, some of the light is converted to electron-hole pairs by the photodiode formed in the section 42. The electron-hole pairs so formed can be used to monitor the operation of the laser diode.

As is shown in FIG. 3, transistor T3 comprises n+ type drain region 41, n+ type source region 43 and conductive gate 49. Electrodes 45 and 47 make ohmic contact to the drain region 41 and to the source region 43, respectively. The source electrode 47 is coupled to an anode of the laser diode LD via a conductor 49. Transistor T5 comprises an n+ type drain region 53, an n+ type source region 55, and a gate electrode 61. Electrodes 57 and 59 make ohmic contact to the drain region 53 and to the source region 55, respectively. The gate electrode 61 is coupled to an anode of the photodiode PD via a conductor 63. Transistors T3 and T5 are separated by portions of region 38 and are separated from LD and PD by isolation region 40. Optionally, transistors T3 and T5 can be separated from each other by an extension (not shown) of isolation region 40.

Figure 4A:
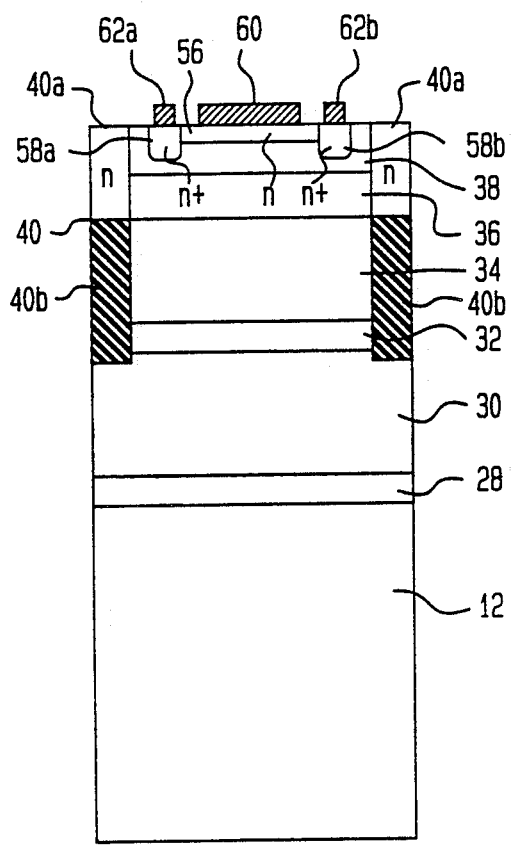
FIG. 4A is a sectional view of an n-channel field effect transistor which is shown in the optoelectronic circuit of FIG. 1.

Referring now to FIG. 4A, there is shown an n-channel depletion mode junction field effect transistor which is denoted as a metal semiconductor field effect transistor (MESFET). The n-channel MESFET comprises a channel region 56 of n-type conductivity (shown as n) in the second cap layer 38, and drain and source regions 58a and 58b, respectively, of high n-type conductivity (shown as n+) are in the second cap layer 38 at the ends of the channel region 56. A metal gate 60 is on the second cap layer 38 over the channel region 56 and forms a Schottky barrier therewith. Metal contacts 62a and 62b are on the second cap layer 38 over the drain and source regions 58a and 58b, respectively, and have ohmic contact therewith. The n-channel MESFET has separation regions 40 on each side thereof and is adapted to be a portion (a separate section) of optoelectronic circuit 11 of FIG. 2. The use of separation regions 40 around transistors is optional.

When the n-channel MESFET is selected to be a portion of optoelectronic circuit 11, it is electrically isolated from the other sections by 1. the layer 38 which is of relatively high resistivity, 2. optional separation regions 40, and 3. the insulating first cap layer 36. The metal contact 60 makes Schottky barrier contact with channel region 56 and serves as the gate of the MESFET. The FET is electrically connected to the laser diode and/or the photodiode by a conductive pattern (not shown) on the surface 38a of the second cap layer 38 to form a desired circuit. Where the desired drive or control circuit requires more than one FET, additional FETs may be formed in the section that comprises FETS and/or the body 18 may be provided with additional sections in which the FETs are formed. The n-channel MESFET could be a p-channel MESFET and there can be a plurality of p-channel and/or n-channel MESFETS formed.

Figure 4B:
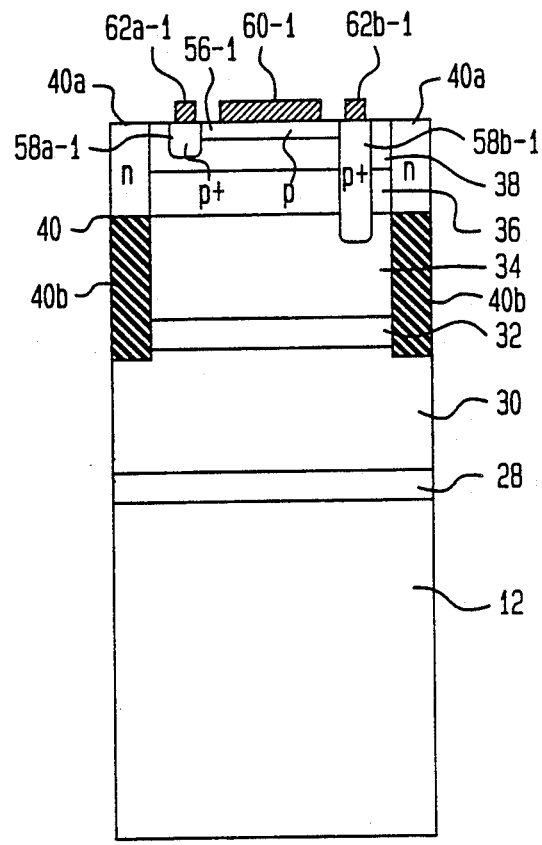
FIG. 4B is a sectional view of a p-channel field effect transistor which can be included in an optoelectronic circuit similar to the optoelectronic circuit of FIG. 1.

Referring now to FIG. 4B, there is shown a p-channel MESFET in a separated portion of optoelectronic circuit 11 of FIG. 2 with a source 58b-1 thereof extended through the cap layers 38 and 36 to the p-type conductivity second cladding layer 34. Thus, one side of the FET can be electrically connected to the laser diode or photodiode internally within the body 18. This p-channel MESFET has a very similar structure to the structure of the n-channel MESFET of FIG. 4a with the drain 58a-1, source 58b-1 and channel 56-1 being of p-type conductivity and having coupled thereto metal contacts 62a-1, 62b-1 and 60-1, respectively.

Resistors can be formed in portions in which FETs are formed by using the structure of the MESFETs of FIGS. 4A and 4B without the metal contact (gate electrode). The resistance of the resulting resistor is a function of the resistivity of the region 56 and the length, width and thickness thereof. The FETS and resistors may be denoted as electrical devices. Diodes, junction transistors, insulated gate field effect transistors, capacitors and the like may also be denoted as electrical devices.

Figure 5:
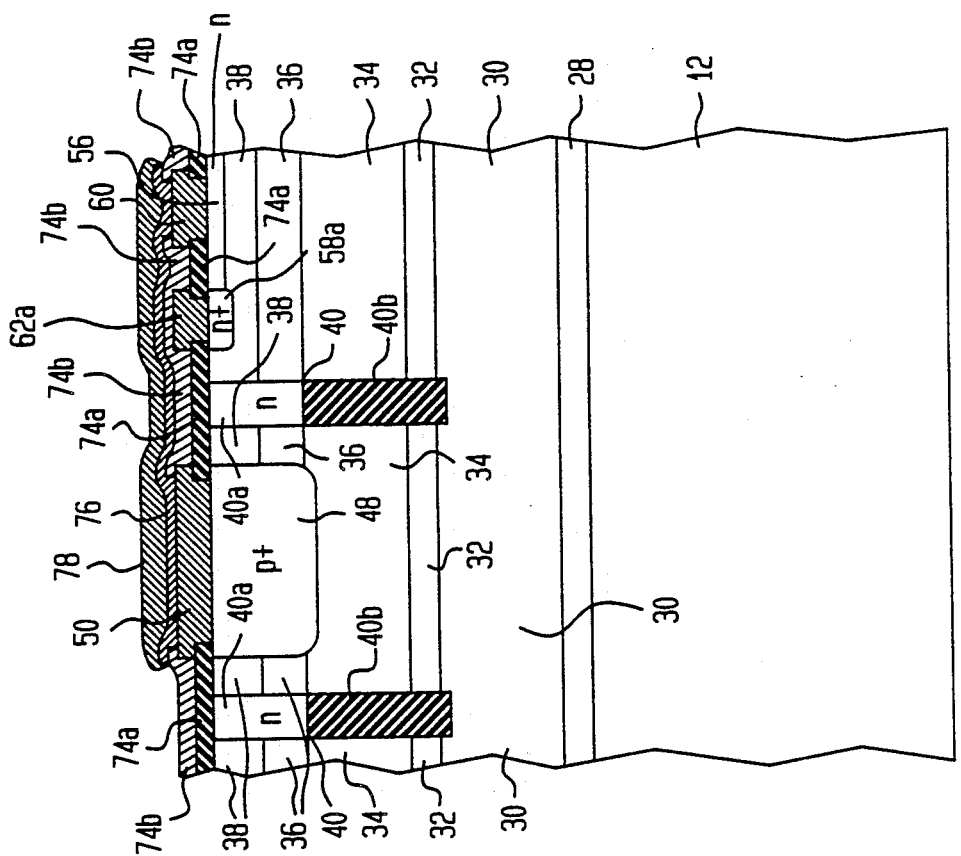
FIG. 5 is a sectional view of a portion of the optoelectronic integrated circuit of the present invention illustrating the manner of forming a portion of the circuit shown in FIG. 1.

Referring now to FIG. 5, there is shown the source region 58b of the FET of FIG. 4A electrically connected to the p-type region 52 of the laser diode of portion 44 of FIG. 2 to form the portion of the circuit 10 of FIG. 1 which is transistor T3 and laser diode LD. Layers 74a and 74b, which are of an electrically insulating material such as silicon dioxide or silicon nitride, are shown on the surface 38a of the second cap layer 38. The gate contact 60 and contacts 62b and 54 extend through openings in the insulating layers 74a and 74b. The gate contact 60 may be a tri-layer of titanium on the cap layer 38, platinum on the titanium and gold over the platinum to form a Schottky barrier with the channel region 56. The contact 62b may be a tri-layer of nickel, a gold germanium alloy and nickel to form an ohmic contact with the n+ type contact region 58. The contact 54 may be a bi-layer of chromium and gold or Ti/Pt/Au to form an ohmic contact with the p-type conductive region 52. A conductive pattern comprising a barrier layer 76 of TiW and a covering outer layer 78 of aluminum extend over the insulating layer 74 between the contacts 62b and 54 to connect the source 58b of the n-channel FET to the laser diode LD. A similar conductive pattern extends from the gate 60 to a contact pad (not shown).

Figure 6:
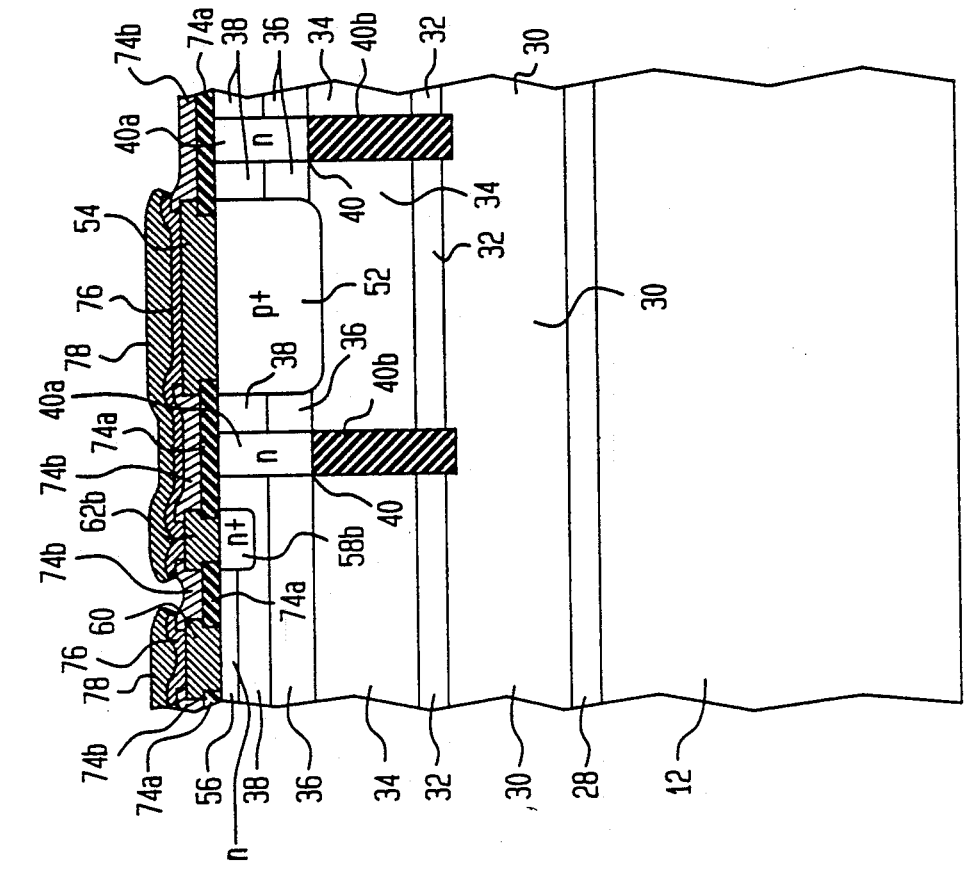
FIG. 6 is a sectional view of a portion of the optoelectronic integrated circuit of the present invention illustrating the manner of forming another portion of the circuit shown in FIG. 1.

Referring now to FIG. 6, there is shown an electrical connection between the gate of an FET of FIG. 4A and the p-type region 48 of the photodiode of portion 42 of FIG. 2 to form the photodiode PD and transistor T5 portion of circuit 10 of FIG. 1. The contact 50 of the photodiode and the gate contact 60 of the FET extend through openings in insulating layers 74a and 74b. In an illustrative example, the contact 50 comprises a bi-layer of chromium and gold to form an ohmic contact with the conductive region 48. The gate 60 is a tri-layer of titanium, platinum and gold. A conductive pattern comprising a barrier layer 76 of TiW and a covering outer layer 78 of aluminum extend over the insulating layer 74 between the gate 60 and the contact 50 to connect them electrically. Optionally, if Ti/Pt/Au metallization is used for the photodiode ohmic contact 50 and for the gate contact 60 for the n-channel transistor, then the interconnection level dielectric layer 74b and layers of TiW/Al 76 and 78 are not needed. The object of a common interconnect metallization of TiW/Al is to connect dissimilar metallizations and to account for an insulating layer between crossing conductors. If the transistor shown in FIG. 6 is rotated 90 degrees relative to the photodiode, the need for a crossover of the source or drain contacts to make contact between the photodiode and the transistor is eliminated.

The integrated circuit 11 can be made by epitaxially depositing the buffer layer 28, first cladding layer 30, active layer 32, second cladding layer 34, first cap layer 36 and second cap layer 38 on the substrate 12 in succession. These layers may be deposited by any well known technique for depositing the particular materials of the layers on the substrate, such as by organo-metallic chemical vapor deposition or by molecular beam epitaxy. The disordered regions 40b may be formed by disordering the active layer 32 and the cladding layer 34 by implanting and/or diffusing an n-type impurity, such as silicon, into the body 18. If the cladding layers 30 and 34 are formed solely of aluminum gallium arsenide, the active layer 32 is disordered by implanting and/or diffusing an n-type impurity therein, and the cladding layer 30 is made electrically insulating by proton bombardment. The conductive regions 48 and 52 may be formed by diffusing a p-type impurity of high solubility, such as zinc, into and through the cap layers 38 and 36. The mirror 72, gate 60, contacts 50, 54, 62 and 68 may be applied by any well known technique for depositing a metal on the materials of the body 18, such as sputtering or evaporation in a vacuum. The metal barrier layer 76 and outer layer 78 of the conductive pattern may also be deposited by sputtering or evaporation in a vacuum and then defined to the desired pattern by standard photolithographic techniques and etching.

Thus, the optoelectronic integrated circuit 11 of the present invention includes in a single body 18 a laser diode, a photodiode and one or more electrical devices {e.g., a field effect transistor (FET)} electrically connected together to form a desired circuit. The photodiode is electrically isolated from the laser diode by separation region 40 which is electrically insulating, but optically transparent, so that the light from the laser diode can reach the photodiode. The FETs are also electrically isolated from the laser diode and the photodiode by the separation regions 40. In addition, the FETs are electrically isolated from the laser diode and photodiode by the first cap layer 36 which is electrically insulating. Although the first cap layer 36 has been described as being of undoped aluminum gallium arsenide, it can be of any high resistance group III-V semiconductor material. The optoelectronic integrated circuit 11 has been described as including two sections which includes a laser diode, a photodiode and optionally one or more FETs and/or resistors.

Figure 7:
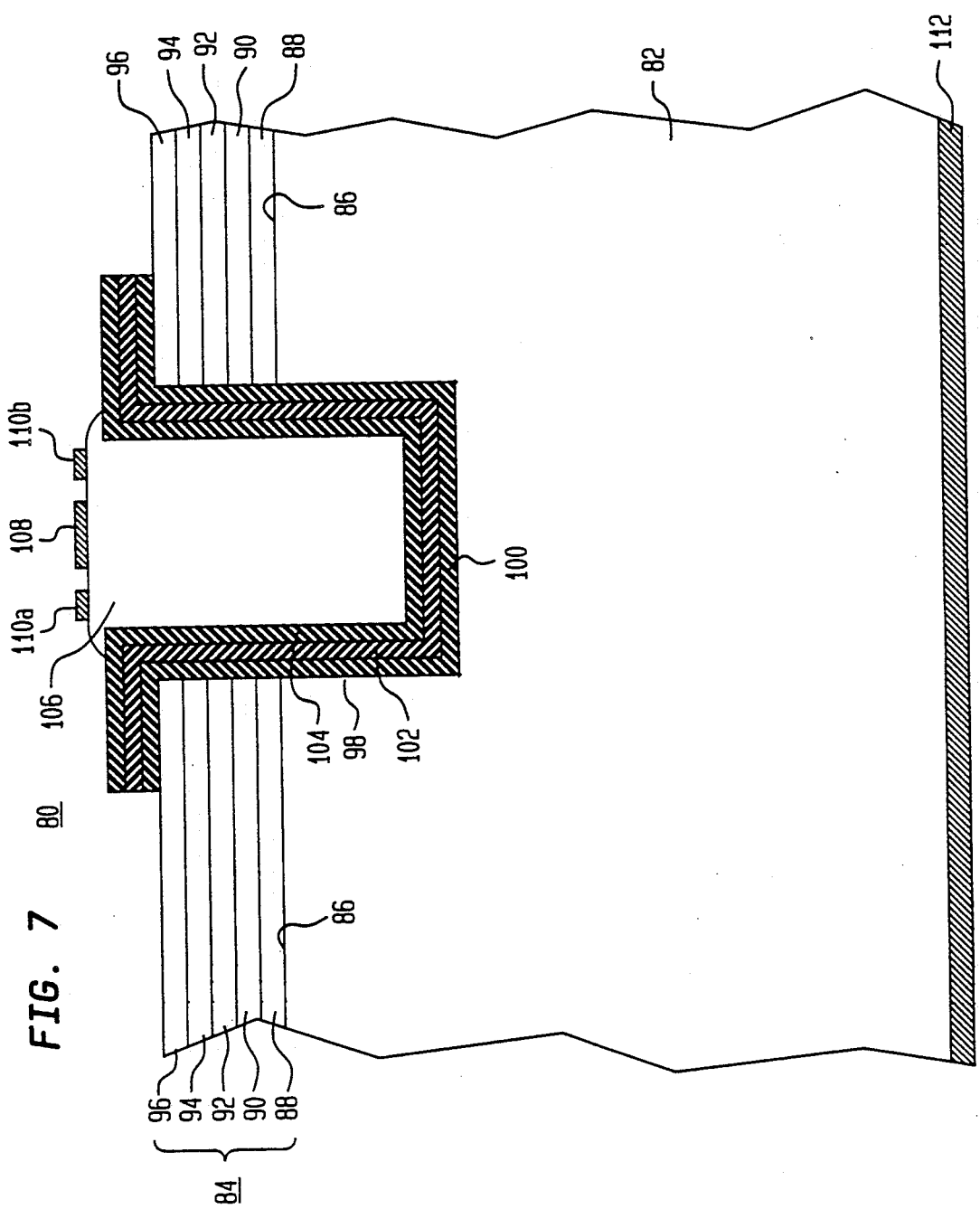
FIG. 7 is a sectional view of a portion of a modification of the optoelectronic integrated circuit of the present invention.

Referring now to FIG. 7, there is shown an optoelectronic integrated circuit 80 in accordance with the invention. The optoelectronic integrated circuit 80 comprises a substrate 82 of a group III-V semiconductor material, such as gallium arsenide, having a body 84 of a group III-V semiconductor material on a surface 86 thereof. The body 84 comprises a buffer layer 88 (typically n-type GaAs), a first cladding layer 90 (typically n-type AlGaAs), an active layer 92 (typically a quantum well GaAs), a second cladding layer 94 (typically p-type AlGaAs), and a cap layer 96. The body 84 forms a laser diode wherein light is generated in the active layer 92.

A rectangular trench 98 extends through the body 84 and a portion of the substrate 82. An electrical insulation is coated over the walls of the trench 98 and a portion of the cap layer 96 around a rim of the trench 98. The insulation comprises a first layer 100 of an insulating material which can be epitaxially deposited on and can be latticed matched with the group III-V materials of the body 84 and substrate 82. Calcium strontium fluoride ($Ca_xSr_{1-x}F_2$) is a highly suitable material for this purpose since it is an excellent thermal and electrical insulator and, in addition, has a fairly low refractive index ($n=1.4$ to 1.5). In addition, it can be lattice matched to the group III-V materials by controlling the strontium concentration. Over the first low index of refraction material layer 100 is a second layer 102 of a high index of refraction material, such as germanium or aluminum gallium arsenide. Over the second high index of refraction material layer 102 is a third layer 104 of a low index of refraction material, such as calcium strontium fluoride. The epitaxial facet layers have thicknesses which are odd multiples of a quarter wavelength in order to form a good reflector.

The remaining volume of the trench 98 is filled with a semiconductor material 106 suitable for forming a photodiode, such as germanium or gallium arsenide. On the surface of the semiconductor material 106 is a first metal contact 108 which forms a Schottky barrier junction with the semiconductor material 106 and second and third contacts 110a and 110b which form ohmic contacts with the semiconductor material 106. This forms a photodiode in the semiconductor material 106 which is electrically and thermally insulated from the laser diode in the body 84. However, the insulating layers 100, 102 and 104 are slightly transparent so that some of the light from the laser diode will pass therethrough into the photodiode where it is detected for use in controlling the laser diode. However, the combined system of layers are mostly reflective so that they act as one of the mirrors for forming the cavity of the laser diode. The other mirror (not shown) is formed on a surface of the body 84 opposite the trench 98. The other mirror (not shown) is partially transparent so as to allow light to be emitted from the laser diode. Thus, the body 84 of the optoelectronic integrated circuit 80 has separate sections, one of which contains a laser diode and another of which contains a photodiode. The two sections are electrically isolated from each other but are optically coupled to allow at least some of the light from the laser diode to pass into the photodiode.

To make the optoelectronic integrated circuit 80, the body 84 is formed in the same manner as previously described with regard to the body 18 of the optoelectronic integrated circuit 11. The trench 98 is formed by masking the surface of the body 84 except where the trench 98 is to be formed, and etching through the exposed portion of the body 84 into the substrate 82 using a suitable wet or dry etching technique for the particular materials of the body and substrate. The calcium strontium fluoride layers 100 and 104 are deposited by either evaporation, sputtering or chemical vapor deposition. The second layer 102 and the semiconductor material 106 are deposited by either an organo-metallic chemical vapor deposition or by molecular beam epitaxy. The various metal layers are deposited by either evaporation in a vacuum or sputtering.

Thus there is provided by the present invention an optoelectronic integrated circuit which comprises a body of a group III-IV semiconductor material having various layers including an active layer in which light can be generated to form a laser diode. The body includes two or more sections which are electrically isolated from each other. One of the sections includes the laser diode, and other sections can include a photodiode and/or FETs. The section which includes the photodiode is optically coupled to the section containing the laser diode so that at least some of the light generated by the laser diode will pass into the photodiode where it will be converted to electron-hole pairs. The laser diode, photodiode and FETs can be electrically connected by a conductive pattern on the surface of the body to form an electrical circuit for driving and/or controlling the optical output of the laser diode.

It is to be understood that the embodiments of the invention which have been described are illustrative of the invention. Modifications may be readily devised by those skilled in the art without departing from the spirit and scope of the invention. For example, in some applications buffer layer 28 can be eliminated. Still further, materials and compositions different than those described for the cladding layers, active layer and capping layer may be used. Still further, lateral confinement can be obtained by means other than through disordering, such as, a ridge-waveguide structure. Furthermore, it is not necessary to have separation regions at both ends to prevent catastrophic damage.

What is claimed is:
1. An optoelectronic integrated circuit comprising:
a body of a group III-V semiconductor material having an active layer extending therethrough;
a first insulating layer sandwiched between the body and a second insulator or semiconductor layer extending parallel to the active layer;
a laser diode, which is adapted to generate light in the active layer during operation thereof, formed in a first section of the circuit which comprises a first portion of the body and first portions of the first and second layers;
a photodiode, which is adapted to receive at least some of the light generated by the laser diode and to generate electron-hole pairs, formed in a second section of the circuit which comprises a second portion of the body and second portions of the first and second layers;
the first and second sections of the circuit being electrically isolated from each other;

an electrical device being formed in a portion of the second layer in a third section of the circuit which comprises a third portion of the body and third portions of the first and second layers; and at least one electrical insulation region extending through a portion of the body including through the active layer.

2. The optoelectronic integrated circuit of claim 1 in which the insulation region is a region in which the semiconductor material is disordered.

3. The optoelectronic integrated circuit of claim 2 in which the insulation region is at least partially transparent to light so as to permit at least some of the light generated by the laser during operation thereof to pass into the photodiode.

4. The optoelectronic integrated circuit of claim 3 in which the body further comprises separate cladding layers on each side of the active layer.

5. The optoelectronic integrated circuit of claim 4 wherein each of the cladding layers is formed of alternating layers of gallium arsenide and aluminum arsenide or aluminum gallium arsenide.

6. The optoelectronic integrated circuit of claim 4 in which the active layer is a multiple quantum well region.

7. The optoelectronic integrated circuit of claim 6 in which the active layer and cladding layers extend across the first, second and third sections and form both the laser diode and the photodiode.

8. The optoelectronic integrated circuit of claim 7 wherein the first layer is undoped aluminum gallium arsenide and the second layer is undoped gallium arsenide with the impurity concentration of the first layer being about an order of magnitude or less than the impurity concentration of the second layer.

9. The optoelectronic integrated circuit of claim 8 in which the electrical device is a field effect transistor.

10. The optoelectronic integrated circuit of claim 9 in which the field effect transistor comprises a channel, source and drain regions formed in the second layer with a conductive gate electrode on a surface of the second layer and lying over the channel region and making a Schottky junction contact with the channel region.

11. The optoelectronic integrated circuit of claim 10 further comprises a second field effect transistor.

12. The optoelectronic integrated circuit of claim 11 in which one of the transistors is an n-channel transistor.

13. The optoelectronic integrated circuit of claim 11 in which one of the transistors is a p-channel transistor.

14. The optoelectronic integrated circuit of claim 13 further comprising electrical devices other than transistors.

15. The optoelectronic integrated circuit of claim 1 wherein the body further comprises a trench extending into the body and across the active layer, an electrically insulating material covers the surface of the trench, a semiconductor material fills the trench and a photodiode is formed in the semiconductor material.

16. The optoelectronic integrated circuit of claim 15 wherein the electrically insulating material comprises alternating layers of a first material which can be epitaxially deposited on the material of the body and has a low index of refraction, and a second material which can be epitaxially deposited on the first material and has a high index of refraction.

17. The optoelectronic integrated circuit of claim 16 in which the first material is calcium strontium fluoride and the second material is aluminum gallium arsenide.

18. The optoelectronic integrated circuit of claim 17 wherein the photodiode comprises a first metal contact on the semiconductor material in the trench and having a Schottky junction contact therewith and two second metal contacts on the semiconductor material and having ohmic contacts therewith.

19. An optoelectronic integrated circuit comprising:
a substrate of a semiconductor material having a surface;
a substantially rectangular body of a group III-V semiconductor material on said substrate surface, said body having a pair of opposed end surfaces;
an active layer in and extending across said body between said end surfaces;
a first layer, which has an impurity concentration of about $10^{10}$ atoms/cm$^3$ or less extending parallel to the active layer and, being sandwiched between the body and a second layer which has an impurity concentration of about $10^{11}$ atoms/cm$^3$ or greater;
a laser diode, which is adapted to generate light in the active layer during operation thereof, being formed in a first section of the circuit which comprises a first portion of the body and first portions of the first and second layers;
a photodiode, which is adapted to receive at least some of the light generated by the laser diode during operation thereof and to generate electron-hole pairs, being formed in a second section of the circuit which comprises a second portion of the body and second portions of the first and second layers;
the first and second sections of the circuit being electrically isolated from each other; and
an electrical device being formed in a portion of the second layer in a third section of the circuit which comprises a third portion of the body and third portions of the first and second layers.

20. The optoelectronic integrated circuit of claim 19 in which the body further comprises a separate cladding layer on each side of the active layer with the active region being a multiple quantum well region.

21. The optoelectronic integrated circuit of claim 20 wherein each of the cladding layers is formed of alternating layers of gallium arsenide and aluminum arsenide or aluminum gallium arsenide.

22. The optoelectronic integrated circuit of claim 21 wherein the first and second sections are electrically isolated from each other by a disordered region of the material of the body which is electrically insulating but at least partially optically transparent so as to allow at least some of the light generated by the laser diode to pass into the photodiode.

23. The optoelectronic integrated circuit of claim 22 in which the isolation region divides the body into at least the first, second and third sections and the electrical device is a field effect transistor.

24. The optoelectronic integrated circuit of claim 23 in which the first layer is undoped aluminum gallium arsenide and and the second layer is undoped gallium arsenide with the impurity concentration of the first layer being about an order of magnitude or lower below the impurity concentration of the second layer.

25. The optoelectronic integrated circuit of claim 24 in which the field effect transistor comprises a channel region and drain and source regions which are all within the second layer and further comprises a gate electrode lying over the channel region of the second layer and in Schottky junction contact with the channel region.

26. The optoelectronic integrated circuit of claim 25 further comprising a mirror on one end surface of the body.

27. The optoelectronic integrated circuit of claim 26 further comprising conductors electrically coupling the laser diode, photodiode and field effect transistor in a desired circuit.

* * * * *